United States Patent
Liu et al.

(10) Patent No.: US 12,283,515 B2
(45) Date of Patent: Apr. 22, 2025

(54) METHOD AND DEVICE TO REDUCE EPITAXIAL DEFECTS DUE TO CONTACT STRESS UPON A SEMICONDCUTOR WAFER

(71) Applicant: Taiwan Semiconductor Manufacturing Company Limited, Hsinchu (TW)

(72) Inventors: Sih-Jie Liu, Hsinchu County (TW); Che-Fu Chiu, New Taipei (TW); Bau-Ming Wang, Kaohsiung (TW); Chun-Feng Nieh, Hsinchu (TW); Huicheng Chang, Tainan (TW); Yee-Chia Yeo, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 205 days.

(21) Appl. No.: 17/000,701

(22) Filed: Aug. 24, 2020

(65) Prior Publication Data
US 2022/0059394 A1 Feb. 24, 2022

(51) Int. Cl.
*H01L 21/687* (2006.01)
*C23C 16/458* (2006.01)

(52) U.S. Cl.
CPC .... *H01L 21/68742* (2013.01); *C23C 16/4586* (2013.01)

(58) Field of Classification Search
CPC .............. H01L 21/68742; C23C 16/4586
USPC ..... 156/345.51, 345.1–345.55; 118/715–733
See application file for complete search history.

(56) References Cited

U.S. PATENT DOCUMENTS

| | | | |
|---|---|---|---|
| 2002/0121312 A1* | 9/2002 | Lubomirsky | H01L 21/68742 141/98 |
| 2003/0069557 A1* | 4/2003 | Driskell | A61F 13/5622 604/386 |
| 2005/0053890 A1* | 3/2005 | Takata | C30B 33/02 432/247 |
| 2007/0006806 A1* | 1/2007 | Imai | H01L 21/67109 118/620 |
| 2007/0159615 A1* | 7/2007 | Horiuchi | H01L 21/67248 355/75 |
| 2009/0321014 A1* | 12/2009 | Ohashi | H01L 24/28 156/305 |
| 2013/0230370 A1* | 9/2013 | Hoey | H01L 21/67745 414/217 |
| 2015/0203965 A1 | 7/2015 | Enomoto et al. | |
| 2015/0314424 A1* | 11/2015 | Kumakura | H01L 21/68742 269/21 |
| 2018/0038892 A1* | 2/2018 | Liao | G01R 1/06783 |
| 2019/0088518 A1* | 3/2019 | Koh | C23C 16/505 |
| 2019/0131728 A1* | 5/2019 | Mardi | H01R 24/50 |

(Continued)

OTHER PUBLICATIONS

Taiwan Patent and Trademark Office, Application No. 110125992 Office Action, mailed Jun. 2, 2022, 6 pages.

*Primary Examiner* — Charlee J. C. Bennett
(74) *Attorney, Agent, or Firm* — The Marbury Law Group, PLLC (57) ABSTRACT

A method of transferring semiconductor wafers and a semiconductor wafer support device including lift pins having a first end configured to contact a backside surface of the semiconductor wafer and at least one stress reduction feature. The stress reduction feature may be configured to reduce contact stress between the lift pins and the wafer.

20 Claims, 6 Drawing Sheets

(56) References Cited

U.S. PATENT DOCUMENTS

| | | | |
|---|---|---|---|
| 2019/0229008 A1* | 7/2019 | Rokkam | H01L 21/68792 |
| 2019/0301000 A1* | 10/2019 | Jordan | C23C 4/11 |
| 2019/0326153 A1* | 10/2019 | Sasaki | H01L 21/6833 |
| 2021/0005504 A1* | 1/2021 | Han | H01L 21/68742 |
| 2022/0059394 A1* | 2/2022 | Liu | C23C 16/4586 |
| 2022/0106451 A1* | 4/2022 | Carbajal | B32B 27/08 |
| 2022/0406575 A1* | 12/2022 | Park | H01L 21/68735 |

* cited by examiner

METHOD AND DEVICE TO REDUCE EPITAXIAL DEFECTS DUE TO CONTACT STRESS UPON A SEMICONDCUTOR WAFER

BACKGROUND

In order to fabricate devices on a semiconductor wafer, a number of unit operations (e.g., masking, etching, deposition, implanting etc.) are performed. Semiconductor wafers may be transported from unit operation to unit operation during device fabrication. To transport the semiconductor wafers to and from each unit operation, a storage container, such as a front opening unified pod (FOUP) may be used. A robot arm may be used to load and unload semiconductor wafers into and out of the FOUP. A transfer blade attached to an articulated robot arm may be positioned under the wafer and used to lift the wafer into and out of the FOUP. As the semiconductor wafers are delivered to a unit operation, the articulated robot arm may raise the semiconductor wafer out of the FOUP and deliver the semiconductor wafer to a chuck for the unit operation. After completion of the unit operation, the robot arm loads the semiconductor wafer back into a FOUP for transport to the next unit operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to transfer and perform unit operations on semiconductor wafers while mitigating damage to the semiconductor wafer caused by the backside lift pins during the loading and unloading of the wafer from an electrostatic chuck (ESC).

As discussed above, a semiconductor wafer may be subjected to a number of unit operations (e.g., masking, etching, deposition, implanting etc.) in order to fabricate a device on the semiconductor wafer. Semiconductor wafers may be transported from unit operation to unit operation during device fabrication. To transport the semiconductor wafers to and from each unit operation, a storage container, such as a front opening unified (or universal) pod (FOUP) may be used. Alternatively, a cluster tool may allow a robotic arm to transfer the semiconductor wafer to different chambers of the cluster tool. Each chamber of the cluster tool may perform a different unit operation. A robot arm may be used to load and unload semiconductor wafers into and out of a FOUP or into and out of different chambers of the cluster tool. A transfer blade attached to an articulated robot arm may be positioned under the wafer and used to lift the semiconductor wafer. As the semiconductor wafers are delivered to a unit operation, the articulated robot arm may deliver the semiconductor wafer to the ESC for the unit operation. As the semiconductor wafer is delivered to the ESC, the semiconductor wafer is lowered on to lift pins of the ESC. The lift pins may be retracted, thus lowering the wafer on to the surface of the ESC. After completion of the unit operation, the lift pins may be raised to lift the semiconductor wafer off the surface of the ESC so that the articulated robot arm in order to allow the robot arm to load the semiconductor wafer back into a FOUP for transport to the next unit operation.

Each time the semiconductor wafer is lowered onto the lift pins as well as each time the lift pins raise the semiconductor wafer off of the ESC, damage may occur to the semiconductor wafer due to the forces exerted on the wafer by the lift pins. The damage to the semiconductor wafer may propagate into succeeding layers deposited on the front side of the semiconductor wafer. Subsequent epitaxial layers may be more sensitive to wafer damage than non-epitaxial layers. For example, epitaxial layer defects may form due to substrate lattice dislocation that occur when the lift pins impact the semiconductor wafer. Oxygen may be precipitated and the silicon oxide defects may form.

Moreover, subjecting the semiconductor wafer to elevated temperatures, such as used in deposition and ion implantation unit operations, may reduce the hardness of the wafer. As a result, the heated semiconductor wafer may be more susceptible to mechanical damage due to the repeated raising and lowering performed by the ESC lift pins.

In an embodiment, the ESC is provided with lift pins that include springs contacting the bottom end of the lift pins. When the semiconductor wafer is loaded onto and/or lifted off the ESC through the embodiment lift pins, the springs included in the lift pins may compress and absorb some of the stress that would have been imparted on to the semiconductor wafer. In another embodiment, the tips of the lift pins may be provided with an elastic cover. Similar to embodiment lift pins with springs, the elastic cover may compress and absorb some of the stress that would have been imparted on to the semiconductor wafer. In another embodiment, the lifts pins may be provided with a more rounded tip than conventional lift pins. That is, rather than the tips of the lift pins ending in a point, the tips of the lift pins may include a flattened or oblate spheroid shape. In this manner, the embodiment lift pins may provide a larger contacting surface area with the backside of the semiconductor wafer. Such a larger contacting surface area may distribute the forces imparted on the semiconductor wafer through the embodiment lift pins, thereby lowering the contact stress for a given contact force.

Figure 1:
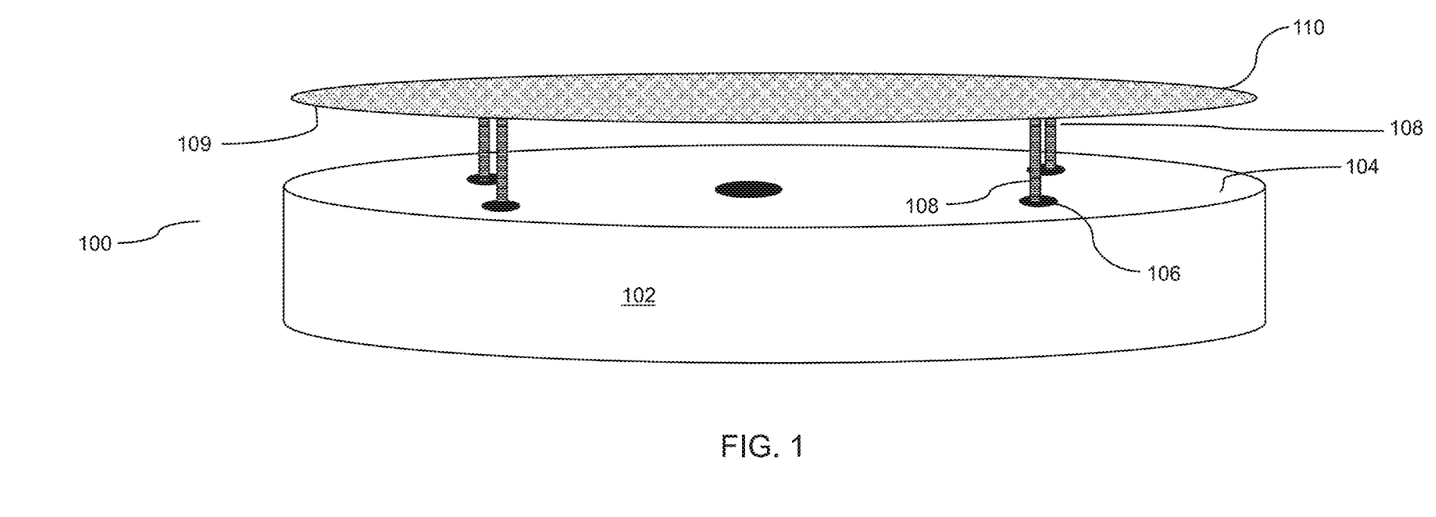
FIG. 1 is a perspective view illustrating an electrostatic chuck with wafer support lift pins extended and supporting a semiconductor wafer in accordance with some embodiments.

FIG. 1 is a perspective view illustrating a semiconductor wafer support device 100, such as an ESC that includes one or more stress reduction features as discussed in more detail below. The stress reduction features are configured to reduce contact stress imparted by the lift pins 108 onto the semiconductor wafer 110. The semiconductor wafer support device 100 includes a base 102 which include several holes 106 in its top surface 104. The lift pins 108 may be extended or retracted through the holes 106 in the top surface 104 of the base 102. The lift pins 108 may have an end that is configured to contact the backside surface 109 of a semiconductor wafer 110. As discussed in more detail below with reference to FIGS. 2-5C, the lift pins 108 may include a supporting pillar 107 which has a first end 107A and a second end 107B. The lift pins 108 may also include a stress-reducing element. In some embodiments, the stress-reducing element may be located at the first end 107A of the supporting pillar 107 while in other embodiments, the stress-reducing element may be located at the second end 107B of the supporting pillar 107. As discussed in more detail below with reference to FIGS. 2-5C, the stress-reducing element may be an elastic segment or may be integrally formed with the supporting pillar 107.

In operation, the lift pins 108 may be extended when receiving a semiconductor wafer 110. The lift pins 108 may be subsequently retracted in order to lower the semiconductor wafer 110 to the top surface 104 of the base 102 of the semiconductor wafer support device 100. Once the semiconductor wafer 110 engages the top surface 104 of the base of the semiconductor wafer support device 100, the unit operation of the device fabrication process may be performed. After the unit operation is performed, the semiconductor wafer 110 may be raised by the lift pins 108 away from the top surface 104 of the base 102 of the semiconductor wafer support device 100 such that a transfer blade (not shown), discussed in more detail below, may be inserted to contact the backside surface 109 of the semiconductor wafer 110. Once the transfer blade engages the backside surface 109 of the semiconductor wafer 110, the semiconductor wafer 110 may be moved to the next chamber of a cluster tool or to a storage box, such as a FOUP. Unit operations may include, but are not limited to masking, deposition, etching, chemical-mechanical polishing, ion implantation, or cleaning.

Figure 2:
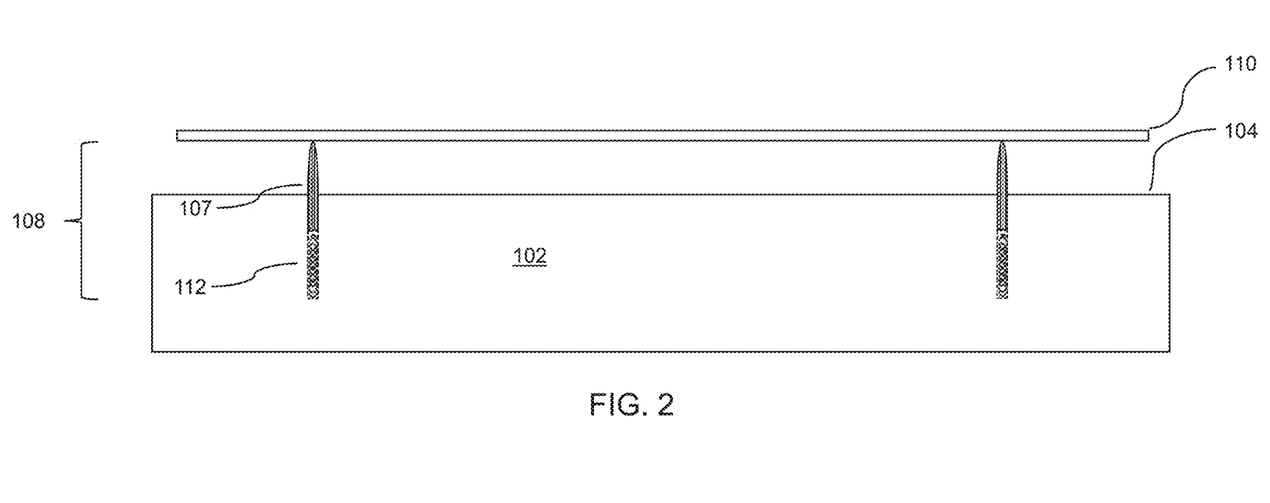
FIG. 2 is a vertical cross-sectional view illustrating an electrostatic chuck with a wafer support lift pins comprising springs in accordance with some embodiments.
Figure 3:
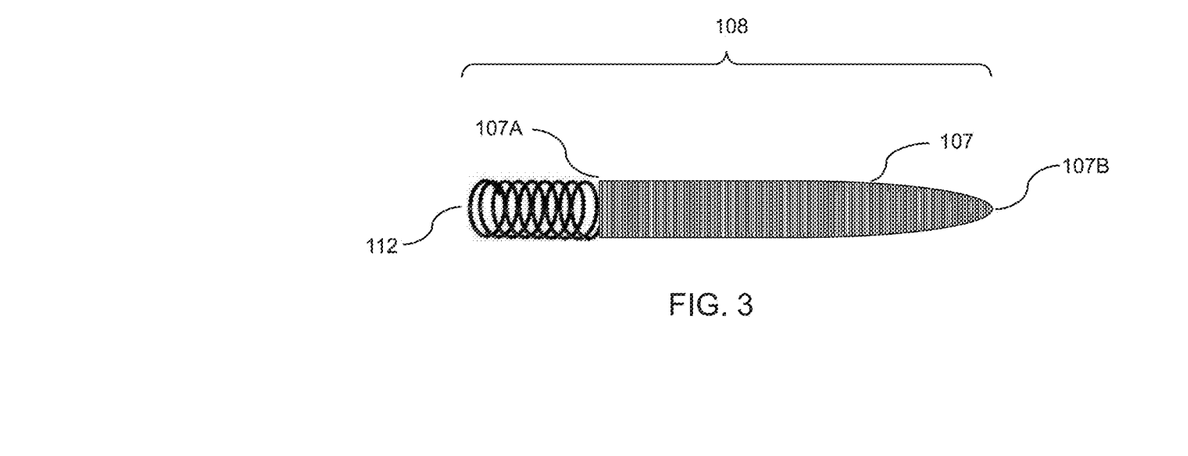
FIG. 3 is a close-up view illustrating the wafer support lift pins of FIG. 2 in accordance with some embodiments.

FIGS. 2 and 3 illustrate embodiment lift pins 108 that provide a stress reduction feature. As illustrated in FIGS. 2 and 3, an elastic element such as a spring 112 may be disposed within the holes 106 of the base 102 of the semiconductor wafer support device 100 prior to inserting the lift pins 108 in the holes 106. As discussed above, at least one lift pin 108 may include a supporting pillar 107 and a stress-reducing element, e.g. spring 112. The supporting pillar 107 may be configured to support the semiconductor wafer 110. The stress-reducing element, spring 112 in this embodiment, connects to the first end 107A of the supporting pillar 107 to reduce contact stress between the lift pins 108 and the semiconductor wafer 110. In an alternative embodiment, springs 112 may be integrally formed with the lift pin 108. In still a further alternative embodiment, the springs 112 may be dimensioned to insert into a recessed cavity (not shown) formed in the first end 107A of the supporting pillar 107. In still another alternative embodiment, the spring 112 may be integrally formed with a bottom surface of the hole 106 and configured to contact a first end 107A of the supporting pillar 107 of the lift pin 108.

A semiconductor wafer 110 may be placed on the lift pins 108 (or the lift pins 108 may be used to raise the semiconductor wafer 110 off the top surface 104 of the base 102 of the semiconductor wafer support device 100). In the embodiment lift pin 108 shown in FIGS. 2 and 3, the springs 112 may compress and thereby absorb some of the contact stress due to weight of the semiconductor wafer 110. In an embodiment, the springs 112 have a lateral spring constant in the range of $7\text{-}8\times10^3$ kg/mm$^2$ and a longitudinal spring constant in the range of $19\text{-}21\times10^3$ kg/mm$^2$, although greater or lesser spring constants may be used in various embodiments of the present disclosure. The spring constant may vary based on the material used to form the spring. Different materials may possess a different shear modulus value. In addition, the coiling of the spring 112 may impact the spring constant. The force, F, that a spring 112 may absorb may be determined by the equation:

$$F = -kx$$

where k is the spring constant and x is the spring displacement amount.

In both instances where the semiconductor wafer 110 is placed down on the lift pins 108 or raised up off the ESC by raising the lift pins 108, the springs 112 may act as a buffer to absorb contact stress and mitigate the damage to the semiconductor wafer 110. For example, a mechanical contact force that exceeds 5.1 gigapascal (GPa) may induce semiconductor wafer 110 damage. By providing the springs 112, contact stress may be absorbed and the damage to the semiconductor wafer 110 may be mitigated.

Figure 4A:
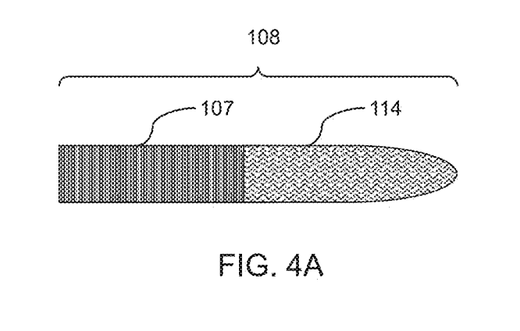
FIG. 4A is a side view illustrating another wafer support lift pin in accordance with some embodiments.
Figure 4B:
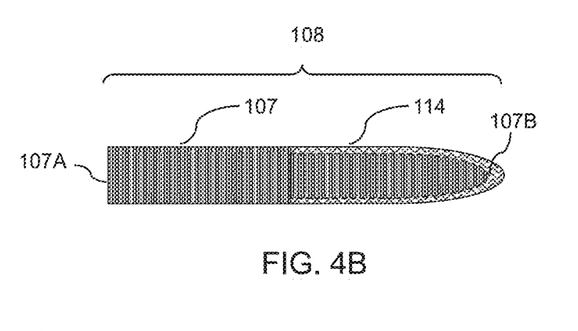
FIG. 4B is a vertical cross-sectional view of the illustrating a cross section of the wafer support lift pins illustrated in FIG. 4A in accordance with some embodiments.

FIG. 4A is a side view of another embodiment lift pin 108 while FIG. 4B is a cross-sectional view of the embodiment lift pin 18 illustrated in FIG. 4A. The embodiment lift pin 108 illustrated in FIGS. 4A and 4B may include another stress reduction element. The stress-reducing element in this embodiment includes an elastic segment, such as an elastic cover 114. In these embodiments, an elastic cover 114 may be disposed over the second end 107B of the supporting pillar 107 of the lift pin 108. A semiconductor wafer 110 may be placed on the elastic cover 114 of the lift pins 108 (or the lift pins 108 are used to raise the semiconductor wafer 110 off the top surface 104 of the semiconductor wafer support device 100). In the embodiment lift pin 108 shown in FIGS. 4A-5C, the elastic cover 114 may compress and thereby absorb at least a portion of the contact stress imparted upon the semiconductor wafer 110 due to weight of the semiconductor wafer 110. In some embodiments, the material used to form the elastic cover 114 may vary in elastic modulus in a direction perpendicular to a major axis of the lift pins 108. In an embodiment, portions of the elastic cover 114 distal to the surface the supporting pillars 107 may have an elastic modulus greater than portions of the elastic cover 114 proximal from the surface of the supporting pillars 107. In some embodiments, elastic cover 114 may be made of a porous material. The elastic modulus may be varied by varying the amount of porosity in the elastic cover 114, with more porosity typically resulting in a lower elastic modulus. In an embodiment the elastic modulus of the elastic cover 114 may be in a range of 50-140 GPa, although materials with greater or lesser elastic modulus may be used.

The amount of contact force, i.e. the amount of force imparted to the semiconductor wafer 110 by the lift pins 108, that may be reduced by using the elastic cover may be determined using Equation 1.

$$\sigma_C(F_N, D_0, E_{\textit{eff}}) = 0.4 * \left[\frac{F_N E_{\textit{eff}}^2}{\left(\frac{D_0}{2}\right)^2}\right]^{1/3} \quad \text{Equation 1}$$

Further the effective modulus, $E_{\textit{eff}}$, may be determined using Equation 2:

$$E_{\textit{eff}}(E_1, v_1, E_2, v_2) = 2 * \left(\frac{1-v_1^2}{E_1} + \frac{1-v_2^2}{E_2}\right) - 1 \quad \text{Equation 2}$$

Where $F_N$: is the normal force; $D_0$: is the diameter of the lift pin 108; $E_{\textit{eff}}$: is the effective modulus; v: is the Poisson ratio; and $E_n$ is the Young's modulus of the semiconductor wafer 110 and the elastic cover 114 of the lift pins 108. The normal force $F_N$ is the force to lift the semiconductor wafer 110.

The Poisson ratio of a material is a measure of the expansion or contraction of a material in a direction perpendicular to the direction of loading. The Young's modulus of a material is a measure of the amount of stress to cause a particular strain in a material. That is, the Young's modulus is a measure of stiffness. The higher the Young's modulus, the stiffer the material. The Poisson ratio and the Young's modulus are properties of the selected materials of the semiconductor wafer 110 and the elastic cover 114 of the lift pins 108.

As can be seen in Equation 1 above, the contact force a that may be reduced by various embodiment stress reduction features may be directly proportional to the normal force $F_N$ and the effective modulus $E_{\textit{eff}}$ and inversely proportion to the diameter $D_0$ of the lift pins 108. Thus, the contact force $\sigma_c$ may be reduced by lowering the normal force $F_N$ and/or the effective modulus $E_{\textit{eff}}$ and/or by increasing the diameter $D_0$ of the lift pins 108. As can be seen in Equation 2 above, the effective modulus $E_{\textit{eff}}$ is weakly proportional, i.e. varying as $(1-v^2)$, to the Poisson ratio $v_1$, $v_2$ of the semiconductor wafer 110 and the elastic cover 114 of the lift pins 108 and inversely proportional to the Young's modulus $E_1$, $E_2$ of the semiconductor wafer 110 and the elastic cover 114 of the lift pins 108. Thus, a change in the Poisson ratios will have a small effect on the effective modulus $E_{\textit{eff}}$ while an increase in the Young's modulus will lower the effective modulus $E_{\textit{eff}}$.

Figure 5A:
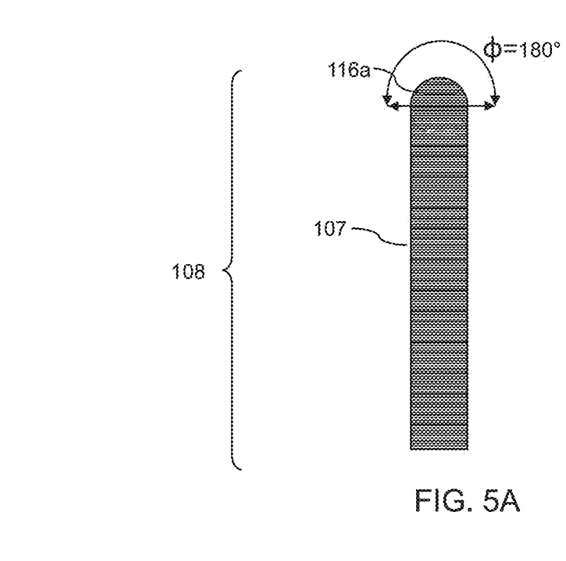
FIGS. 5A-5C are side views illustrating another wafer support lift pin in accordance with some embodiments.
Figure 5B:
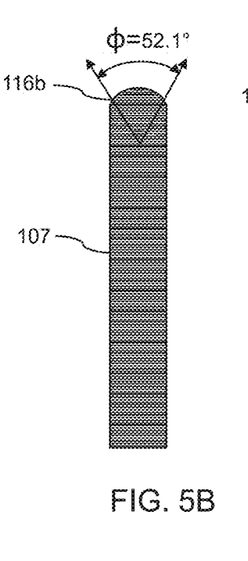
Figure 5C:
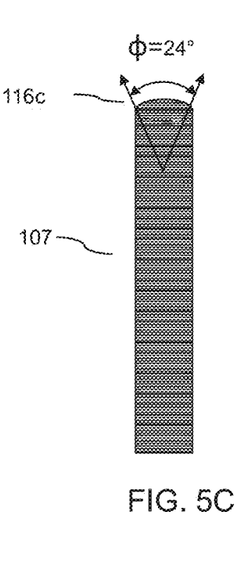

FIGS. 5A-5C are side views of another embodiment lift pin 108. The embodiment lift pins 108 illustrated in FIGS. 5A-5C may include additional stress reduction features. The stress-reducing element can be integrally formed with the supporting pillar 107. In various embodiments, the diameter of the supporting pillar 107 of the lift pin 108 may be in the range of 2-10 mm. However, the diameter of the supporting pillars 107 may be larger or smaller as desired.

In a first aspect illustrated in FIG. 5A, a tip 116a disposed at the second end 107B of the supporting pillar 107 may be rounded/flattened relative to conventional lift pins. The tips 116a may be spherical in shape or slightly flattened into an oblate spheroid shape. As illustrated in FIG. 5A, in embodiments in which the tip 116a is essentially spherical, the spherical angle is essentially 180 degrees. Thus, the radius of curvature of such an embodiment tip 116a may be the same radius as the supporting pillar 107. For example, if the diameter of the supporting pillar 107 is 4 mm, the radius is 2 mm. Using a tip as shown in FIG. 5A, the radius of curvature of the tip 116a is also 2 mm and the spherical angle is essentially 180 degrees. Thus, in such an embodiment, the radius of curvature of the tip 116a may be the same (1:1) as the radius of the supporting pillar 107.

In a second aspect illustrated in FIG. 5B, a tip 116b disposed at the second end 107B of the supporting pillar 107 may have a greater flattening than the embodiment tip 116a illustrated in FIG. 5A. In embodiments as illustrated in FIG. 5B, the lift pin 108 may be configured with a tip 116B that may be described as an oblate spheroid or ellipsoid in shape. For example, the radius of curvature of the tip 116b may be twice the radius of the supporting pillar 107 of the lift pin 108, resulting in a spherical angle q of approximately 52.1 degrees. In an example lift pin 108 in which the diameter of the supporting pillar 107 is 4 mm and the radius of the supporting pillar is 2 mm, the tip 116b as shown in FIG. 5B may have a radius of curvature of 4 mm and the spherical angle of approximately 52.1 degrees. Thus, in such an embodiment, the radius of curvature of the tip 116b may be twice (2:1) the radius of the supporting pillar 107.

In a third aspect illustrated in FIG. 5C, a tip 116c disposed at the second end 107B of the supporting pillar 107 may have yet even a greater flattening than the embodiment tip 116a illustrated in FIG. 5A and embodiment tip 116b of FIG. 5B. That is, the tips 116c has an even larger spherical angle φ. In an embodiment, the radius of curvature may be 5 times the radius of supporting pillar 107 of the lift pin 108, resulting in a spherical angle φ of approximately 24 degrees. In an example lift pin 108 in which the diameter of the supporting pillar 107 is 4 mm and the radius of the supporting pillar is 2 mm, the tip 116c as shown in FIG. 5C may have a radius of curvature of 10 mm and the spherical angle of approximately 24 degrees. Thus, in such an embodiment, the radius of curvature of the tip 116c may be five times (5:1) the radius of the supporting pillar 107.

In various embodiments, the radius of curvature of the tips 116a-116c may be in the range of 1-5 times the radius of the supporting pillar 107 of the lift pins 108. Put another way, the ratio of the radius of curvature of the tips 116a-116c as compared to the radius of the supporting pillar 107 of the lift pins 108 may be (1:1) to (5:1). However, the radius of curvature of the tips 116a-116c may be larger or smaller as desired. Alternatively, the tips 116a-116c may be described in terms of spherical angle q. In various embodiments, the spherical angle φ of the tips 116a-116c may be in the range of 24-180 degrees. For example, the tip may be provided with a spherical angle φ in the range of 50-180 degrees. Moreover, the tip may be provided with a spherical angle φ in the range of 90-180 degrees. By providing a more flattened pin tip 116C (i.e., smaller spherical angle φ), the surface area of the tip (116a-c) disposed on the supporting pillar 107 of the lift pin 108 may be increased. The increased surface may distribute the force imparted upon the semiconductor wafer 110 over a larger surface area, thus reducing the contact stress.

The amount of contact force that may be reduced by using the elastic cover may be determined using Equation 1, where the flattened tips 116a-116c may vary the value of the diameter of the lift pin 108, $D_0$.

Figure 6A:
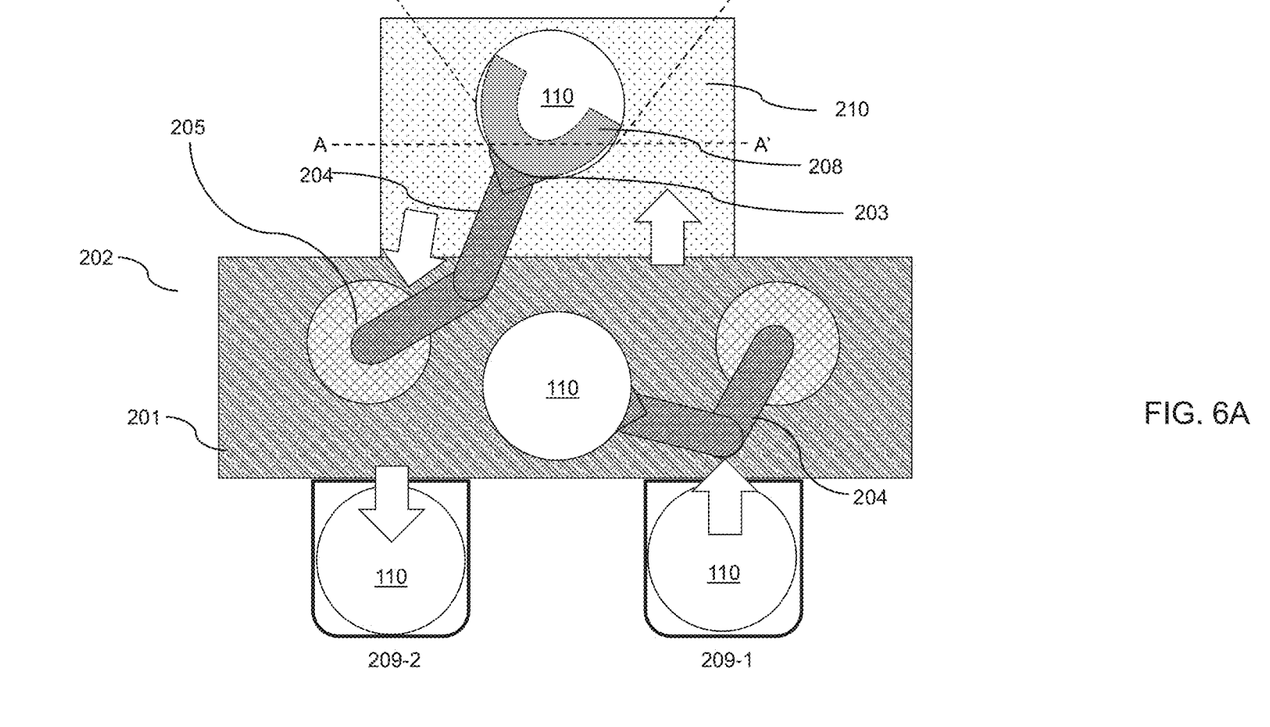
FIG. 6A is a plan view illustrating a semiconductor wafer transfer system in accordance with some embodiments.
Figure 6B:
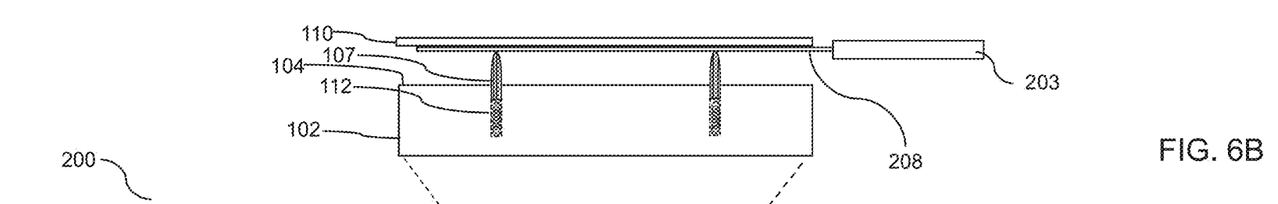
FIG. 6B is a vertical cross-sectional view illustrating a cross section of the wafer transfer system of FIG. 6A along line AA' in accordance with some embodiments.

FIGS. 6A and 6B illustrates a semiconductor wafer processing system 200 according to various embodiments. The semiconductor wafer processing system 200 incudes a semiconductor wafer transfer apparatus 202 which includes at least one articulated robot arm 204. A first end 203 of the articulated robot art 204 includes a transfer blade 208 while a second end 205 is rotatably connected to a housing 201. The articulated robot arm 204 may be configured so that it may rotate and translate to more easily transfer the semiconductor wafers 110. The transfer blade 208 may be configured to lift and support a semiconductor wafer 110 during transfer of the semiconductor wafer 110 from a first FOUP 209-1 to a unit operation 210 in a semiconductor fabrication process. The unit operation may be, but is not limited to masking, deposition, etching, chemical-mechanical polishing (CMP), ion implantation, or cleaning, etc. After performing the desired unit operation processing step, the semiconductor wafer 110 may be removed from the unit operation by the same or a different articulated robot arm 204. In one aspect, the semiconductor wafer 110 may be transferred to a second FOUP 209-2. The second FOUP 209-2 may be carried, by hand or mechanically via a rail system (not shown), to the next unit operation 210. In another aspect, the semiconductor wafer processing system 200 may be part of a cluster tool (not shown) that includes several unit operations 210 in a cluster. In this aspect, the semiconductor wafer transfer apparatus 202 may transfer the semiconductor wafer 110 from one unit operation 210 to the next unit operation 210 within the same cluster without using a FOUP.

As illustrated in FIG. 6B, a semiconductor wafer 110 supported on the transfer blade 208 of the wafer transfer apparatus 202 may be maneuvered so that the semiconductor wafer 110 is located over the lift pins 108 of a semiconductor wafer support device 100, such as an ESC, associated with the unit operation 210. The lift pins 108 may be raised to support the semiconductor wafer 110. Once the semiconductor wafer 110 is supported by the lift pins 108 the transfer blade 208 may be removed. The lift pins 108 may include any of the stress reduction features disclosed with reference to FIGS. 2-5C. FIG. 6B illustrates, for example, the springs 112 disposed with the lift pins 108. The semiconductor wafer 110 may then be lowered to the top surface 104 of the semiconductor wafer support device 100 (e.g., ESC).

Figure 7:
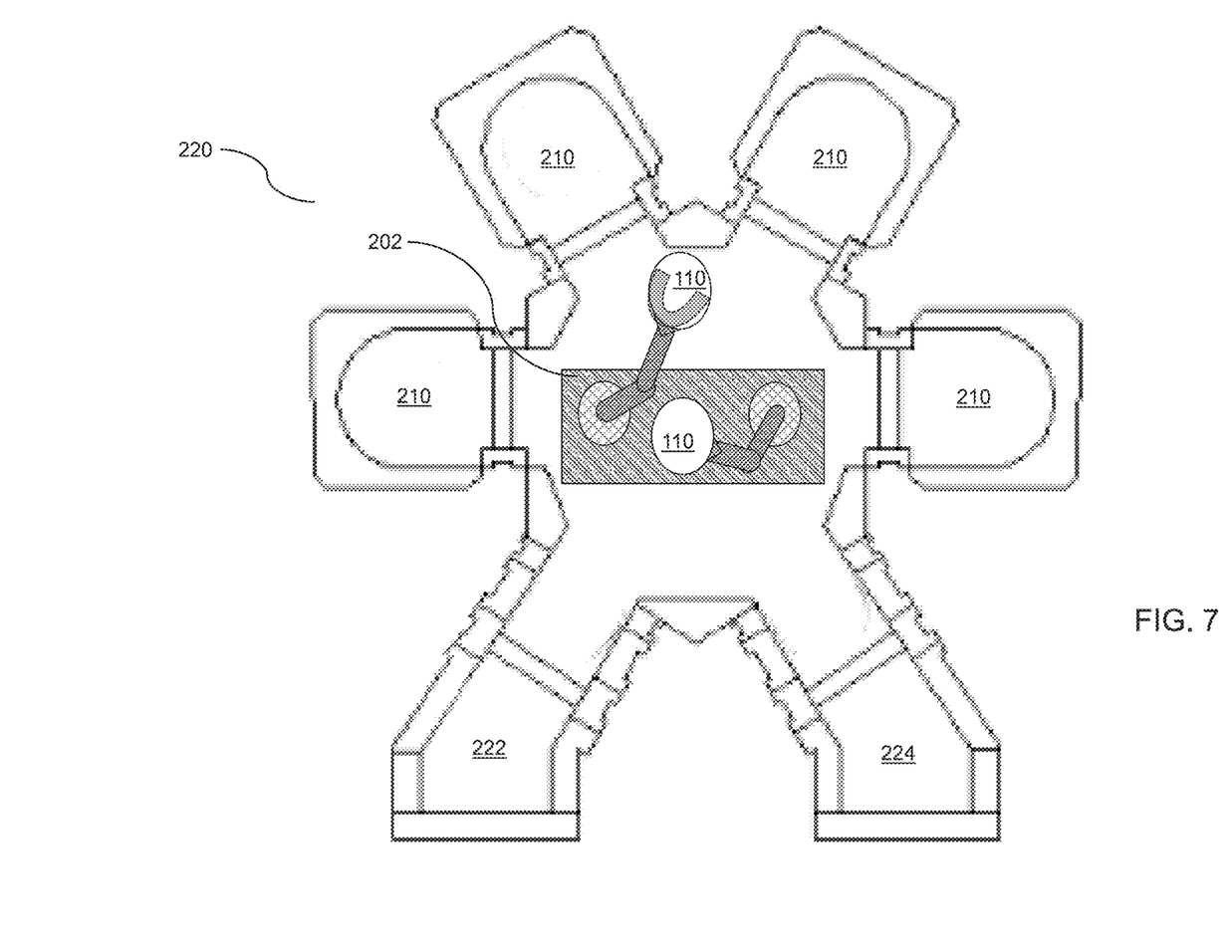
FIG. 7 is a horizontal cross-sectional view illustrating a cross section of a cluster tool with a semiconductor wafer transfer system in accordance with some embodiments.

FIG. 7 illustrates a cluster tool 220 which includes a wafer transfer apparatus 202 as discussed above. As illustrated, the cluster tool 220 may be configured for four unit operation chambers 210. Each unit operation may occur in a unit operation chamber 210. However, the cluster tools 220 may be configured with more or fewer unit operation chambers 210. The cluster tool 220 may be configured with a separate inlet 222 and a separate outlet 224 so that unprocessed semiconductor wafers 110 may be provided to the cluster tool 220 via the separate inlet 222 and processed semiconductor wafers 110 may be removed from the cluster tool 220 via the separate outlet 224.

Figure 8:
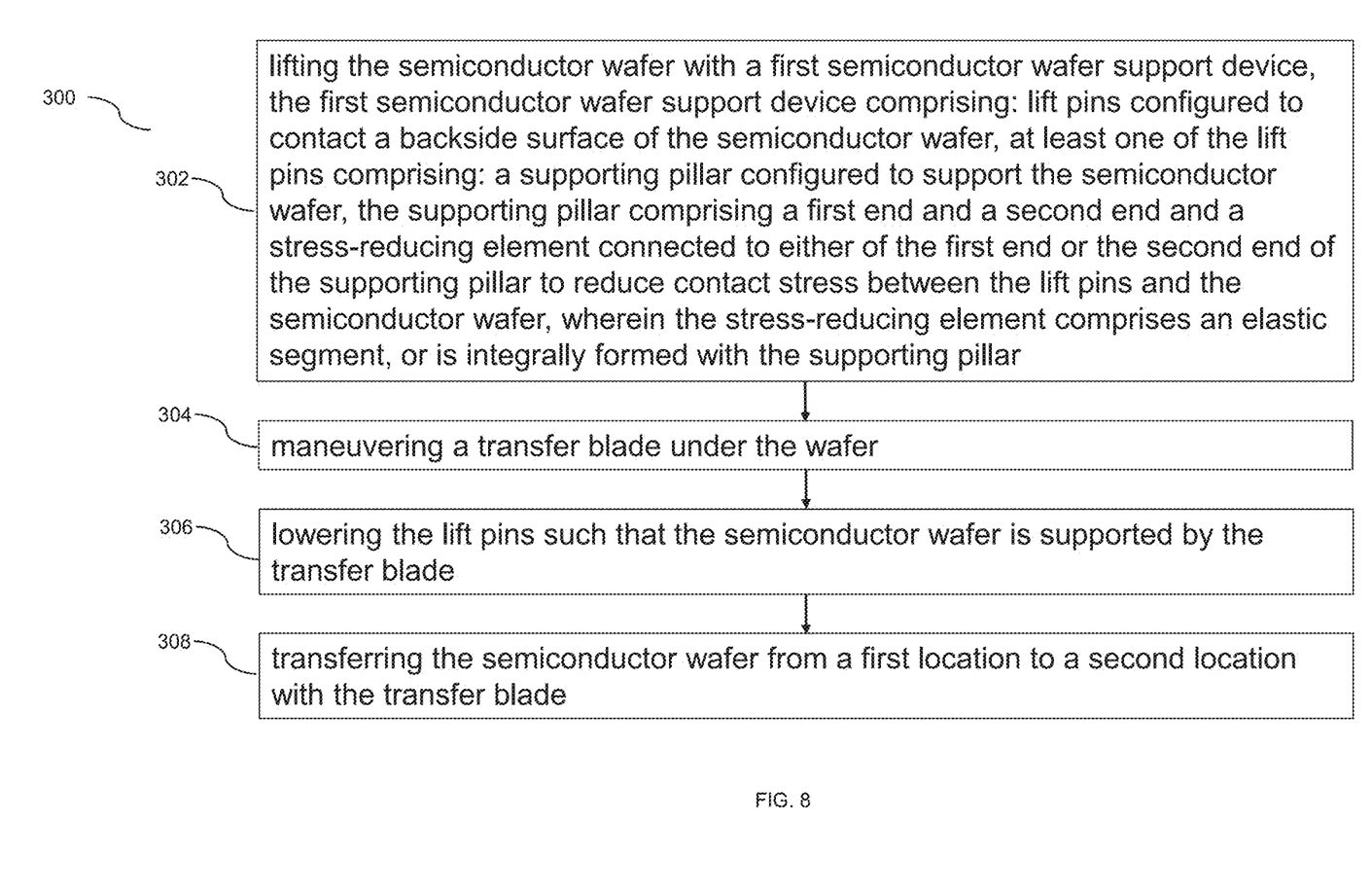
FIG. 8 is a flowchart illustrating a method of transferring a semiconductor wafer in accordance with some embodiments.

FIG. 8 is a flowchart illustrating a method 300 of transferring a semiconductor wafer 110 in accordance with some embodiments. Referring to step 302, a semiconductor wafer 110 may be lifted with a first semiconductor wafer support device 100. The first semiconductor wafer support device 100 may include lift pins 108 configured to contact a backside surface 109 of the semiconductor wafer 110. At least one of the lift pins 108 includes a supporting pillar 107 configured to support the semiconductor wafer 110. The supporting pillar 107 includes a first end 107A and a second end 107B. The lift pins 108 also include a stress-reducing element illustrated in FIGS. 2-5C (e.g., springs 112, elastic cover 114, rounded tips 116A, 116B, 116C 116a, 116b, 116c) connected to either of the first end 107A or the second end 107B of the supporting pillar 107 to reduce contact stress between the lift pins 108 and the semiconductor wafer 110. The stress-reducing element may include an elastic segment, or is integrally formed with the supporting pillar. Referring to step 304, a transfer blade 208 may be maneuvered under the semiconductor wafer 110. Referring to step 306, the lift pins 108 may be lowered such that the semiconductor wafer 110 is supported by the transfer blade 208. Referring to step 308, the semiconductor wafer 110 may be transferred from a first location to a second location with the transfer blade 208. In some embodiments, the first location may be a first semiconductor processing unit operation 210 and the second location may be a FOUP 209-2.

In some embodiments, the semiconductor wafer 110 may be transferred from the second location to a third location. In some embodiments, the second location may be a FOUP 209-1 and the third location may be a second unit operation 210. The method may include removing the semiconductor wafer 110 from the FOUP 209-1 with the transfer blade 208, maneuvering the semiconductor wafer 110 from the FOUP 209-1 to a second semiconductor processing unit operation 210 and lifting a second semiconductor wafer support device 100 to support the semiconductor wafer 110. The second unit operation 210 may include a second semiconductor wafer support device 100 configured to support the semiconductor wafer 110. The second semiconductor wafer support device 100 may include second lift pins 108 configured to contact a backside surface 109 of the semiconductor wafer 110 and at least one second stress reduction feature illustrated in FIGS. 2-5C (e.g., springs 112, elastic cover 114, rounded tips 116a, 116b, 116c). The at least one second stress reduction feature may be configured to reduce contact stress between the second lift pins 108 and the semiconductor wafer 110. The at least one second stress reduction feature, similar to the first stress reduction feature, may include springs 112 configured to contact a first end 107a of the supporting pillar 107, an elastic cover 114 covering the first end 107A of the supporting pillar 107, the first end 107A of the supporting pillars 107 may have an oblate spheroid shape (116a-116c) or combinations thereof.

Generally, the structures and methods of the present disclosure can be used to transfer and perform unit operations 210 on semiconductor wafers 110 while mitigating damage to the semiconductor wafer 110 caused by the lift pins 108 during loading and unloading of the semiconductor wafer 110 from a semiconductor wafer support device 100, such as an ESC. The mitigation of the damage to the semiconductor wafer 110, in turn, mitigates damage propagating from the damaged semiconductor wafer into layers deposited on the semiconductor wafer, in particular epitaxial layers. In an embodiment, the semiconductor wafer support device 100 may be provided with springs 112 contacting the bottom end of the supporting pillars 107. When the semiconductor wafer 110 is loaded/lifted onto the lift pins 108, the springs 112 may compress and absorb some of the stress on the semiconductor wafer 110. In another embodiment, the tips of the lift pins 108 may be provided with an elastic cover 114. Similar to the springs 112 in the previous embodiment, the elastic cover 114 may have an elastic modulus that allows the elastic cover 114 to compress as the semiconductor wafer 110 is loaded/lifted on to the lift pins 108, thereby absorbing some of the stress on the semiconductor wafer 110. In another embodiment, the lifts pins 108 may provide a more rounded tip 116a-116c than conventional lift pins. That is, rather than the tips ending in a point, the tips of the supporting pillars of the lift pins 108 may have a flattened or oblate spheroid shape 116a-116c. In this manner, the lift pins 108 may provide a larger contacting surface area with the backside of the semiconductor wafer 110. The larger contacting surface may distribute the force imparted upon the semiconductor wafer 110 over a greater surface area, thereby lowering the contact stress for a given contact force.

An embodiment is drawn to a semiconductor wafer support device 100 including lift pins 108 configured to contact a backside surface 109 of a semiconductor wafer 110. At least one of the lift pins 108 includes a supporting pillar 107 configured to support the semiconductor wafer 110. The supporting pillar 107 includes a first end 107A and a second end 107B. The semiconductor wafer support device 100 also includes a stress-reducing element (e.g., springs 112, elastic cover 114, rounded tips 116a, 116b, 116c) connected either of the first end 107A or the second end 107B of the supporting pillar 107 to reduce contact stress between the lift pins 108 and the semiconductor wafer 110. The stress-reducing element may include an elastic segment (e.g., springs 112, elastic cover 114) or is integrally formed with the supporting pillar (e.g., rounded tips 116a, 116b, 116c).

Another embodiment is drawn to a semiconductor wafer processing system 200 including an articulated robot arm 204 having a first end and a second end, a transfer blade 208 located at the first end of the articulated robot arm 204 and a semiconductor processing unit operation 210 comprising a semiconductor wafer support device 100. The semiconductor wafer support device 100 may include lift pins 108 configured to contact a backside surface 109 of a semiconductor wafer 110. At least one of the lift pins 108 includes a supporting pillar 107 configured to support the semiconductor wafer 110. The supporting pillar 107 includes a first end 107A and a second end 107B. The semiconductor wafer support device 100 also includes a stress-reducing element (e.g., springs 112, elastic cover 114, rounded tips 116a, 116b, 116c) connected either of the first end 107A or the second end 107B of the supporting pillar 107 to reduce contact stress between the lift pins 108 and the semiconductor wafer 110. The stress-reducing element may include an elastic segment (e.g., springs 112, elastic cover 114) or is integrally formed with the supporting pillar (e.g., rounded tips 116a, 116b, 116c).

Another embodiment is drawn to a method 300 of transferring a semiconductor wafer 110 including lifting the semiconductor wafer 110 with a first semiconductor wafer support device 100. A semiconductor wafer 110 may be lifted with a first semiconductor wafer support device 100. The first semiconductor wafer support device 100 may include lift pins 108 configured to contact a backside surface 109 of the semiconductor wafer 110. At least one of the lift pins 108 includes a supporting pillar 107 configured to support the semiconductor wafer 110. The supporting pillar 107 includes a first end 107A and a second end 107B. The lift pins 108 also include a stress-reducing element illustrated in FIGS. 2-5C (e.g., springs 112, elastic cover 114, rounded tips 116a, 116b, 116c) connected to either of the first end 107A or the second end 107B of the supporting pillar 107 to reduce contact stress between the lift pins 108 and the semiconductor wafer 110. The stress-reducing element may include an elastic segment, or is integrally formed with the supporting pillar. A transfer blade 208 may be maneuvered under the semiconductor wafer 110. The lift pins 108 may be lowered such that the semiconductor wafer 110 is supported by the transfer blade 208. Referring to step 308, the semiconductor wafer 110 may be transferred from a first location to a second location with the transfer blade 208.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer support device comprising:
lift pins configured to contact a backside surface of a semiconductor wafer, at least one of the lift pins comprising:
a supporting pillar configured to support the semiconductor wafer, the supporting pillar comprising a first end and a second end, wherein a tip having an oblate spheroid or ellipsoid shape is disposed on the second end; and
a stress-reducing element connected to the supporting pillar to reduce contact stress between the lift pins and the semiconductor wafer, wherein the stress-reducing element comprises at least one elastic segment comprising:
an elastic cover comprising a first part configured to cover the tip disposed at the second end and a second part configured to cover a portion of the supporting pillar that extends from the second end, wherein the elastic modulus of the material of the elastic cover varies in a first direction along the extension of the supporting pillar, and a first elastic modulus of a material of the first part of the elastic cover is greater than a second elastic modulus of a material of the second part of the elastic cover, wherein the first direction along the extension of the supporting pillar is perpendicular to a second direction along the thickness of the supporting pillar.

2. The semiconductor wafer support device of claim 1, wherein the at least one elastic segment further comprises a spring configured to contact the first end of the supporting pillar, wherein the elastic cover contacts the backside surface of the semiconductor wafer, wherein the spring is integrally formed with the supporting pillar and configured to absorb at least a portion of a contact stress between the lift pin and the semiconductor wafer.

3. The semiconductor wafer support device of claim 2, wherein the spring has a lateral spring constant in a range of $7\text{-}8 \times 10^3$ kg/mm$^2$ and a longitudinal spring constant in a range of $19\text{-}21 \times 10^3$ kg/mm$^2$.

4. The semiconductor wafer support device of claim 1, wherein the elastic cover absorbs at least a portion of the contact stress between the lift pin and the semiconductor wafer.

5. The semiconductor wafer support device of claim 1, wherein the elastic cover varies in elastic modulus in a direction perpendicular to a major axis of the lift pins.

6. The semiconductor wafer support device of claim 1, wherein the elastic cover comprises a porous material.

7. The semiconductor wafer support device of claim 1, wherein the stress-reducing element is integrally formed with the supporting pillar, the stress-reducing element comprising the second end of the supporting pillar having an oblate spheroid shape, wherein a radius of curvature of the stress-reducing element may be in a range of 1-5 times a radius of the supporting pillar.

8. The semiconductor wafer support device of claim 1, wherein the semiconductor wafer support device comprises an electrostatic chuck comprising:
 a base configured to support the semiconductor wafer; and
 holes in the base,
 wherein the lift pins are located in the holes and are configured to lift the semiconductor wafer off the base and lower the semiconductor wafer on to the base.

9. A semiconductor wafer processing system comprising:
 an articulated robot arm having a first end and a second end;
 a transfer blade located at the first end of the articulated robot arm; and
 a semiconductor processing unit operation comprising a semiconductor wafer support device, the semiconductor wafer support device comprising:
  lift pins configured to contact a backside surface of a semiconductor wafer, at least one of the lift pins comprising:
   a supporting pillar configured to support the semiconductor wafer, the supporting pillar comprising a first end and a second end, wherein a tip having an oblate spheroid or ellipsoid shape is disposed on the second end; and
   a stress-reducing element connected to the supporting pillar to reduce contact stress between the lift pins and the semiconductor wafer, wherein the stress-reducing element comprises at least one stress reduction feature comprising:
    an elastic cover comprising a first part configured to cover the tip disposed at the second end and a second part configured to cover a portion of the supporting pillar that extends from the second end, wherein the elastic modulus of the material of the elastic cover varies in a first direction along the extension of the supporting pillar, and a first elastic modulus of a material of the first part of the elastic cover is greater than a second elastic modulus of a material of the second part of the elastic cover, wherein the first direction along the extension of the supporting pillar is perpendicular to a second direction along the thickness of the supporting pillar.

10. The semiconductor wafer processing system of claim 9, wherein the at least one stress reduction feature further comprises:
 a spring to contact the first end of the supporting pillar, wherein the second end of the supporting pillar contacts the backside surface of the semiconductor wafer, wherein the spring is configured to absorb at least a portion of a contact stress between the lift pin and the semiconductor wafer; or
 the second end of the supporting pillar having an oblate spheroid shape; or
 a combination thereof.

11. The semiconductor wafer processing system of claim 10, wherein the articulated robot arm is configured to rotate and translate.

12. The semiconductor wafer processing system of claim 11, wherein the semiconductor wafer processing system comprises a cluster tool.

13. The semiconductor wafer support device of claim 1, wherein an elastic modulus of the elastic cover may be in a range of 50-140 GPa.

14. The semiconductor wafer processing system of claim 9, wherein the semiconductor wafer support device is an electrostatic chuck.

15. A semiconductor wafer support system comprising:
 a first electrostatic chuck comprising:
  a first set of lift pins configured to contact a backside surface of a semiconductor wafer, at least one lift pin of the first set of lift pins comprising:
   a first supporting pillar configured to support the semiconductor wafer, the first supporting pillar comprising a first end and a second end, wherein a tip having an oblate spheroid or ellipsoid shape is disposed on the second end; and
   a first stress-reducing element connected to the first supporting pillar to reduce contact stress between the at least one lift pin of the first set of lift pins and the semiconductor wafer, wherein the first stress-reducing element comprises at least one first elastic segment comprising:
    a first elastic cover comprising a first part configured to cover the tip disposed at the second end of the first supporting pillar and a second part configured to cover a portion of the first supporting pillar that extends from the second end, wherein the elastic modulus of the material of the first elastic cover varies in a first direction along the extension of the first supporting pillar, and a first elastic modulus of a material of the first part of the first elastic cover is greater than a second elastic modulus of a material of the second part of the first elastic cover, wherein the first direction along the extension of the first supporting pillar is perpendicular to a second direction along the thickness of the first supporting pillar;
  a first base configured to support the semiconductor wafer; and
  at least one hole in the first base, wherein the at least one lift pin of the first set of lift pins is located in the at least one hole in the first base and is configured to lift the semiconductor wafer off the first base and lower the semiconductor wafer onto the first base.

16. The semiconductor wafer support system of claim 15, further comprising:
 an articulated robot arm having a first end and a second end;

a transfer blade located at the first end of the articulated robot arm; and a front opening unified pod (FOUP), wherein the at least one lift pin of the first set of lift pins is configured to lift the semiconductor wafer off the first base and lower the semiconductor wafer onto the transfer blade, and wherein the articulated robot arm is configured to transfer the semiconductor wafer to the FOUP and to transfer the semiconductor wafer from the FOUP onto top surfaces of the at least one lift pin of the first set of lift pins.

17. The semiconductor wafer support system of claim 16, further comprising:
a second electrostatic chuck comprising:
   a second set of lift pins configured to contact the backside surface of the semiconductor wafer, at least one lift pin of the second set of lift pins comprising:
      a second supporting pillar configured to support the semiconductor wafer, the second supporting pillar comprising a first end and a second end, wherein a second tip having an oblate spheroid or ellipsoid shape is disposed on the second end; and
      a second stress-reducing element connected to the second supporting pillar to reduce contact stress between the at least one lift pin of the second set of lift pins and the semiconductor wafer, wherein the second stress-reducing element comprises at least one second elastic segment comprising:
         a second elastic cover configured to cover the second tip disposed at the second end of the second supporting pillar and a portion of the second supporting pillar that extends from the second end of the second supporting pillar;
   a second base configured to support the semiconductor wafer; and
   at least one hole in the second base, wherein the at least one lift pin of the second set of lift pins is located in the at least one hole in the second base and is configured to lift the semiconductor wafer off the second base and lower the semiconductor wafer onto the second base.

18. The semiconductor wafer support system of claim 17, wherein the at least one lift pin of the second set of lift pins is configured to lift the semiconductor wafer off the second base and lower the semiconductor wafer onto the transfer blade, and wherein the articulated robot arm is configured to transfer the semiconductor wafer to the FOUP and to transfer the semiconductor wafer from the FOUP onto top surfaces of the at least one lift pin of the second set of lift pins.

19. The semiconductor wafer support system of claim 15, wherein the first stress-reducing element further comprises:
   a spring configured to contact the first supporting pillar, wherein the spring is integrally formed with the first supporting pillar and configured to absorb at least a portion of a contact stress between the first end of the at least one lift pin of the first set of lift pins and the semiconductor wafer.

20. The semiconductor wafer support system of claim 15, wherein the first elastic cover absorbs at least a portion of the contact stress between the at least one lift pin of the first set of lift pins and the semiconductor wafer.

\* \* \* \* \*